United States Patent
McGrath

(10) Patent No.: US 6,541,705 B1
(45) Date of Patent: Apr. 1, 2003

(54) CABLE MANAGEMENT RACK

(75) Inventor: Michael J. McGrath, New Lenox, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 09/627,520

(22) Filed: Jul. 28, 2000

(51) Int. Cl.[7] .............................................. H02G 3/04
(52) U.S. Cl. .................. 174/99 R; 174/68.3; 174/72 A; 174/101
(58) Field of Search ................................ 174/99 R, 48, 174/49, 68.3, 72 R, 72 A, 97, 100, 101; 361/826

(56) References Cited

U.S. PATENT DOCUMENTS

| | | | |
|---|---|---|---|
| 5,127,082 A | 6/1992 | Below et al. ................ | 385/135 |
| 5,412,751 A | 5/1995 | Siemon et al. ............... | 385/135 |
| 5,542,549 A | 8/1996 | Siemon et al. ................ | 211/26 |
| 5,804,765 A | 9/1998 | Siemon et al. ............ | 174/65 R |
| D401,566 S | 11/1998 | Gesmondi et al. ......... | D13/177 |
| 5,898,129 A | 4/1999 | Ott et al. ...................... | 174/59 |
| 5,902,961 A | 5/1999 | Viklund et al. ............. | 174/100 |
| 5,945,633 A | 8/1999 | Ott et al. ...................... | 174/59 |
| 6,101,773 A * | 8/2000 | Chau et al. ................ | 52/220.7 |
| 6,102,214 A * | 8/2000 | Mendoza ..................... | 211/26 |
| 6,245,998 B1 * | 6/2001 | Curry et al. .............. | 174/72 A |
| 6,365,834 B1 * | 4/2002 | Larsen et al. ............... | 174/100 |

* cited by examiner

*Primary Examiner*—Dean A. Reichard
*Assistant Examiner*—W. David Walkenhorst
(74) *Attorney, Agent, or Firm*—Robert A. McCann; Jay A. Saltzman; Christopher S. Clancy

(57) ABSTRACT

A management rack for facilitating the routing and organization of a plurality of elongated members. The rack includes a frame, a spanning element having distinct edges thereof attached to the frame at distinct portions thereof, an organizational element disposed on the spanning element for routing and organizing at least some of the plurality of elongated members, a first hinge support disposed in a first location on the frame, a second hinge support disposed in a second location on the frame, and a door having a first hinge for engaging the first hinge support and having a second hinge for engaging the second hinge support whereby the door is rotatable on the hinges between a closed position where the portion of the frame between the first and second hinge supports is substantially covered by the door and thereby generally inaccessible and an open position where the portion of the frame between the first and second hinge supports is substantially uncovered by the door and thereby generally accessible.

9 Claims, 7 Drawing Sheets

CABLE MANAGEMENT RACK

BACKGROUND OF THE INVENTION

As the applications for telecommunications systems grow ever numerous and diverse, the need for more efficient communications management systems grows correspondingly great. In a given system, the junction point for voice, data, and other communications hardware can become a spaghetti-like nightmare without appropriately configured and connected communications management racks. For smaller applications, a single, smaller board may suffice, while larger applications may demand many adjacent or arrayed full-size cable management racks.

A known design that has evolved for such racks is one having a tall, rectangular metal frame with various types of electrical equipment mounted thereto or otherwise situated thereon. In a common arrangement, one face of the rack is utilized to accommodate input and output lines while the opposite face is reserved for connecting cables for interconnecting specified inputs to specified outputs. In another common arrangement, a rack system would include several racks adjacently aligned, with the rack on one end of the alignment accommodating input lines and the rack on the opposite end of the alignment providing output lines, the cable connections within and between the intermediate racks serving to appropriately connect the inputs and outputs in the desired configuration, as well as to provide pathways to and from intermediate electrical components.

Though the cable configuration on a particular rack can vary, such racks typically have cabling running vertically proximate the vertical sides of the frame, sometimes in a special channel or similar structure, while specific cables turn to extend horizontally across the rack to connect with a specific active or passive electrical device mounted on the rack, such as a patch panel, splice drawer, connector module or fiber optic enclosure for example. These racks also commonly include horizontal cable routing structure at both the top and bottom ends to accommodate and control cables entering or existing a rack system as well as cables routed between racks spaced apart within a rack system. Duct material or intermediate cable management structure may be used to route and organize the cabling on the rack to whatever degree is necessary in the particular system.

Once such a communications rack or a series of such communications racks is connected in a desirable configuration, however, there are several concerns. One significant concern is aesthetics. The large number and total length of cables in a particular system may present an eyesore in certain applications. Also, an abundance of visible cabling may foster misperceptions relating to the quality or efficiency of the particular connection configuration. Another concern is the protection of the cables and connectors from hostile environmental factors, such as dust or other elements which may degrade connectivity. Protection of the cables, and the configuration more generally, is also desired from inadvertent human contact. Particularly where there may be slack in the cabling, there is a risk of inadvertent disruption of the configuration due to unprotected cables being pulled or snagged by a passerby.

While the above concerns have been recognized, there has been an equal or greater concern about maintaining easy access to the cabling due to the need to frequently change a particular configuration. As such, rack manufacturers have been reluctant to provide much in the way of protection or aesthetic-enhancing structure. U.S. Pat. No. 5,902,961 to Viklund et al., for example, discloses a cable manager having a number of channel retainers mounted to a vertical channel for facilitating retention of cables within the vertical channel. Such design fails to adequately address aesthetics by removing the cables from view, provides little if any protection from dust or other airborne hazards that may affect connectivity, and offers only a quantum of protection against inadvertent disruption of the configuration. Furthermore, such design requires the opening or pivoting of approximately six distinct channel retainers to access the length of cabling in a single channel.

SUMMARY OF THE INVENTION

To address the above-recited concerns pertaining to aesthetics and protection while maintaining efficient access, the present invention includes a management rack for facilitating the routing and organization of a plurality of elongated members. The rack includes a frame, a spanning element having distinct edges thereof attached to the frame at distinct portions thereof, an organizational element disposed on the spanning element for routing and organizing at least some of the plurality of elongated members, a first hinge support disposed in a first location on the frame, a second hinge support disposed in a second location on the frame, and a door having a first hinge for engaging the first hinge support and having a second hinge for engaging the second hinge support whereby the door is rotatable on the hinges between a closed position where the portion of the frame between the first and second hinge supports is substantially covered by the door and thereby generally inaccessible and an open position where the portion of the frame between the first and second hinge supports is substantially uncovered by the door and thereby generally accessible.

In another form, the invention includes a hingeable door for use on a management rack for facilitating the routing and organization of a plurality of elongated members. The rack includes a frame, a spanning element having distinct edges thereof attached to the frame at distinct portions thereof, an organizational element disposed on the spanning element for routing and organizing at least some of the plurality of elongated members, a first hinge support disposed in a first location on the frame, and a second hinge support disposed in a second location on the frame. The hingeable door includes a generally planar panel portion, a first hinge disposed on a first portion of the panel portion for engaging the first hinge support of the frame, and a second hinge disposed on a second portion of the panel portion for engaging the second hinge support of the frame. The door is rotatable on the hinges between a closed position where the panel portion covers a portion of the frame and an open position where the panel portion does not cover the portion of the frame.

In yet another form, the invention includes a cable management rack for facilitating the routing and organization of a plurality of cables. The rack includes a generally rectangular frame including a pair of longitudinal support members each having opposing ends, a pair of transverse support members connecting the longitudinal support members at the opposing ends, an intermediate transverse member extending from one of the pair of longitudinal support members to the other of the pair of longitudinal support members and disposed between and generally parallel to the pair of transverse support members, a plurality of organizational elements disposed on the at least one intermediate transverse member for routing and organizing the plurality of cables, a first hinge-supporting bushing disposed proximate one of the opposing ends of one of the longitudinal support members, a second hinge-supporting bushing disposed proximate the opposing end of the one longitudinal support member, and a door having a generally planar panel portion, a first hinge for engaging the first bushing and a second hinge for engaging the second bushing, whereby the door is rotatable on the hinges between a closed position where the portion of the frame between the first and second hinge supports is substantially covered by the door and thereby generally inaccessible and an open position where the portion of the frame between the first and second hinge supports is substantially uncovered by the door and thereby generally accessible.

The disclosed invention provides an improved combination of aesthetics and protection over known cable management racks while maintaining the ease of access required for such applications.

DETAILED DESCRIPTION OF PREFERRED EMBODIMENTS

Figure 1:
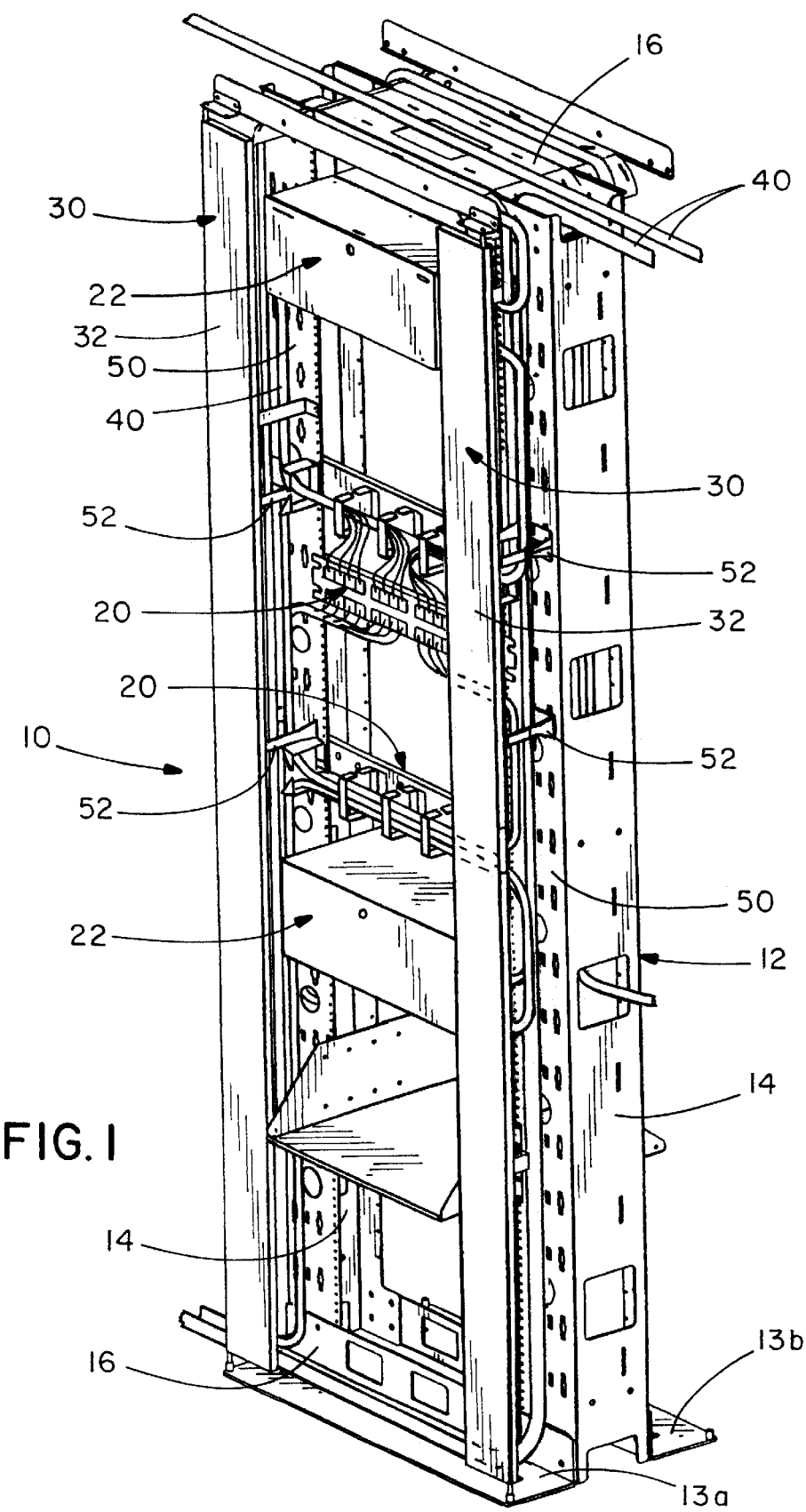
FIG. 1 is a perspective view of a management rack in accordance with an embodiment of the invention wherein the doors are in a closed position.
Figure 2:
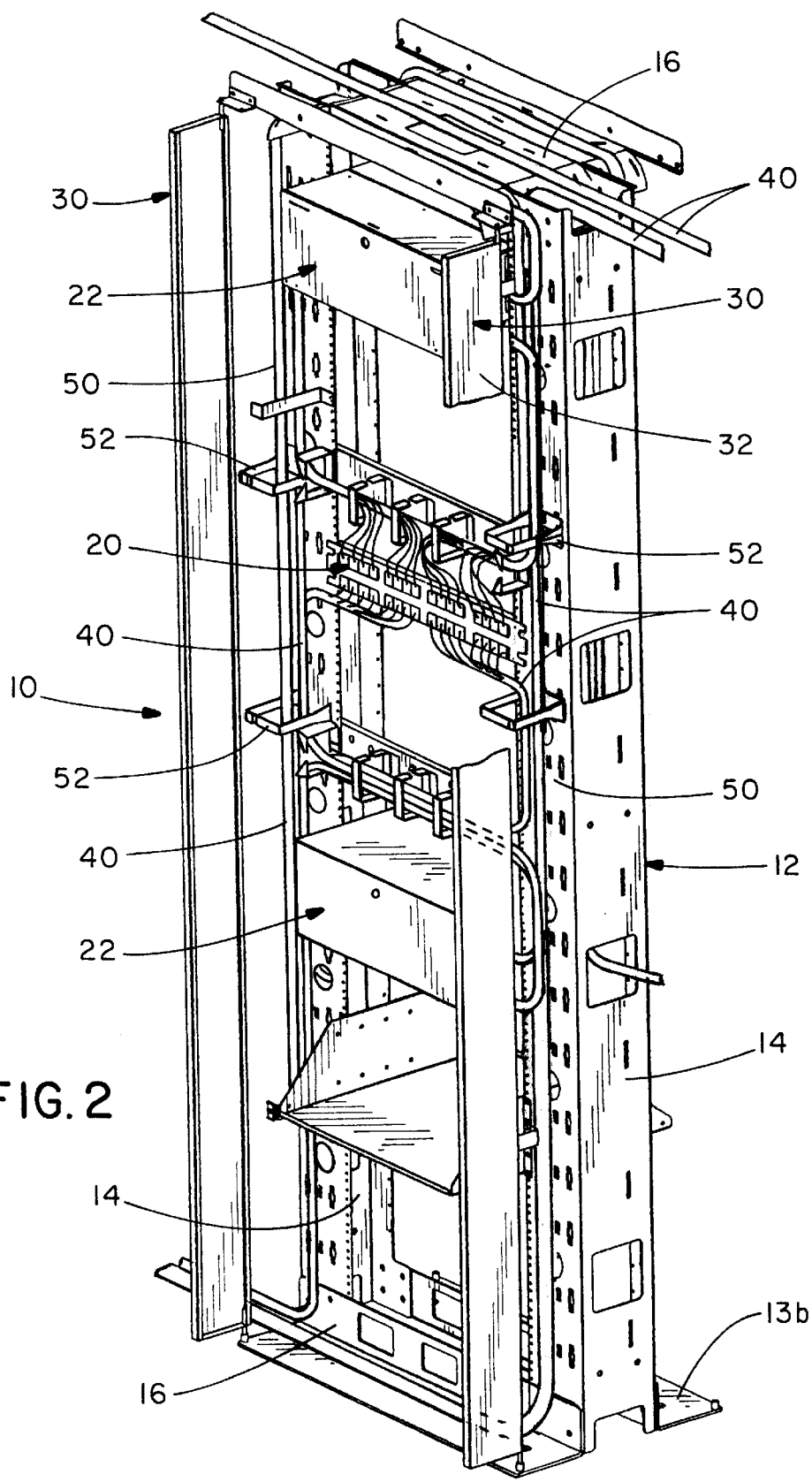
FIG. 2 is a perspective view of the management rack of FIG. 1 wherein the doors are in a 90° open position.
Figure 3:
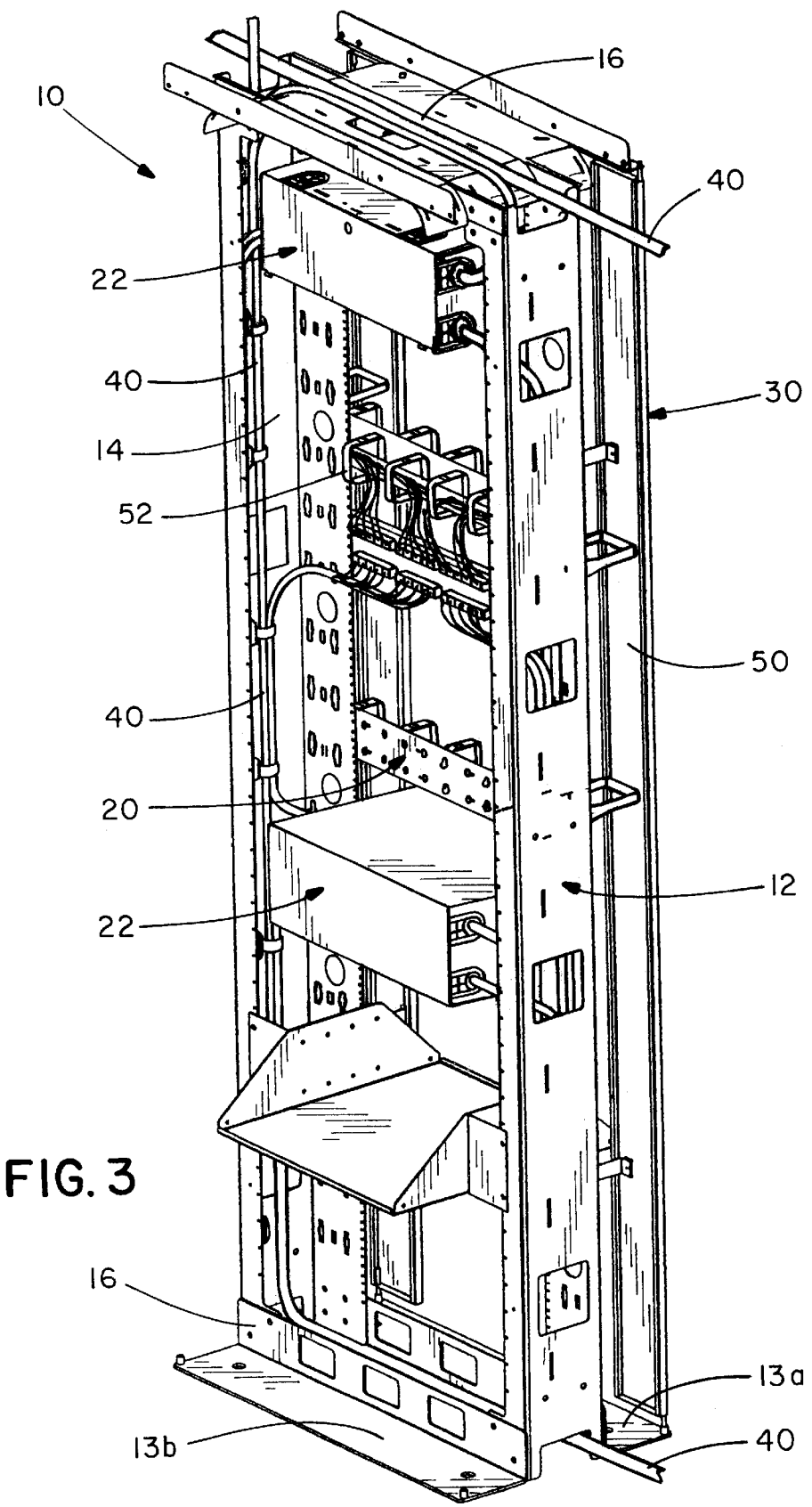
FIG. 3 is a perspective view of the management rack of FIG. 1 taken generally from an opposite direction as the perspective view of FIG. 1.
Figure 4:
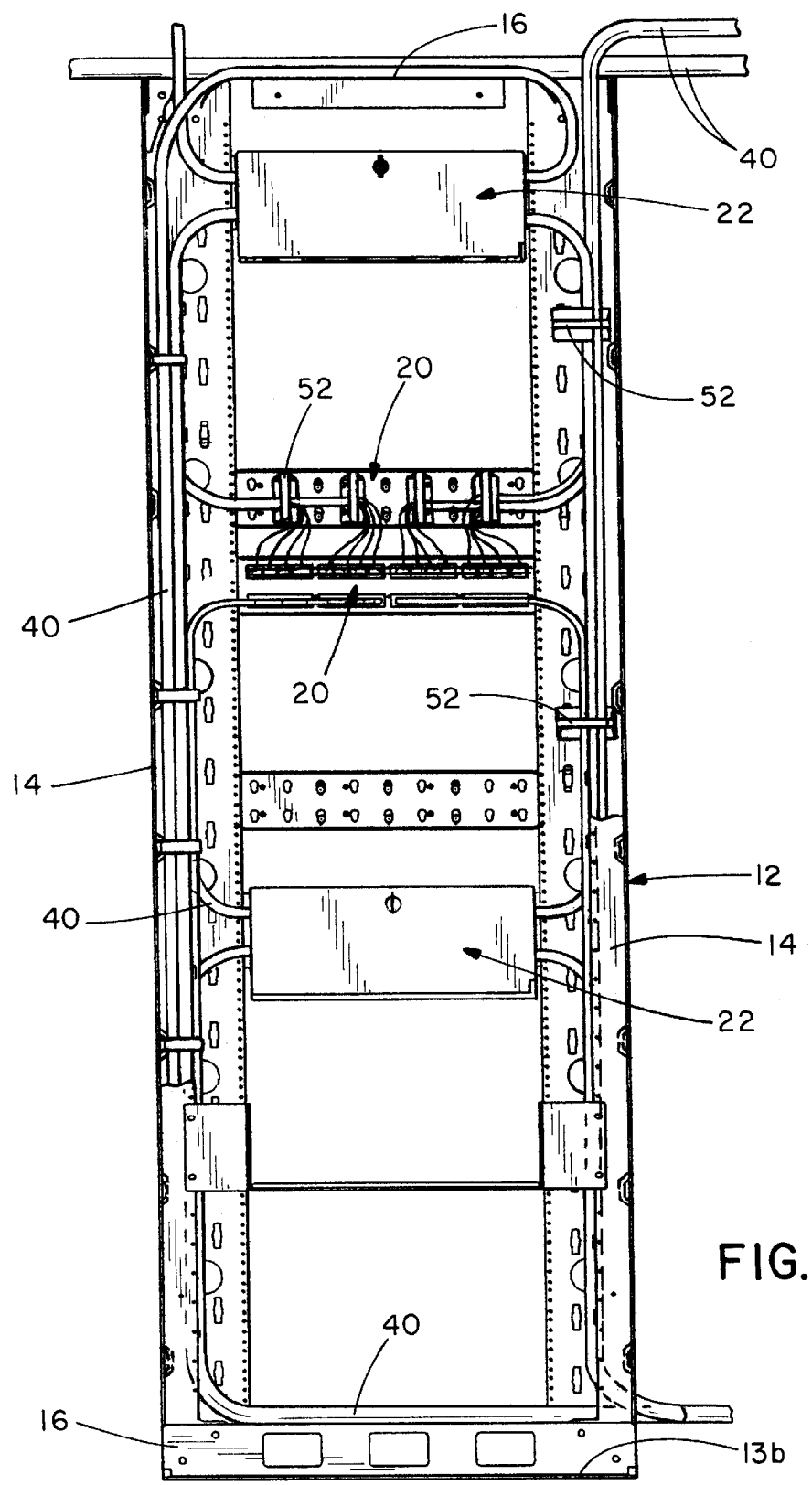
FIG. 4 is a rear elevational view of the management rack of FIG. 1.

Preferred embodiments of the inventive management rack are described herein with reference to the aforedescribed figures.

FIGS. 1–4 show a generally vertical rectangular management rack 10 in accordance with an embodiment of the invention. The rack facilitates the routing, organization, and interconnection of flexible elongated members, such as cables, thereon. The rack includes a rectangular frame 12 having one or more base portions 13 for supporting the rack on a generally flat surface, such as a floor. The frame 12 includes a pair of longitudinal support portions 14 and a pair of transverse support portions 16 which generally combine to form the rectangular shape of the frame 12. The respective support portions of the frame can be integral or, as in the illustrated embodiment, formed of separately connected pieces, such as welded metal beams.

Spanning from one point on the rectangular frame to another point on the frame are one or more spanning elements 20. In the illustrated embodiment, the spanning elements 20 are transverse members spanning from one longitudinal support portion 14 to the other and disposed intermediately between the transverse support portions 16. Such spanning elements may support one or more organizational elements 22 thereon for selectively organizing and/or interconnecting particular elongated members 40, such as cables. For example, cables may be routed to one or more active or passive electrical devices, such as patch panels, splice drawers, connector modules and fiber optic cable enclosures mounted on one or more such spanning elements 20.

The vertically oriented, longitudinal support portions 14 of the frame 12 generally are provided with routing structures for vertical cabling adjacent thereto. While the embodiment shown utilizes a plurality of cable management rings 52, it is to be understood that any of the known structures for creating a cable routing pathway 50, such as D-rings, wiring duct, etc. could be utilized. Preferably, therefore, the longitudinal support portions 14 will include numerous mounting apertures spaced therealong for providing optional D-ring attachment along the length thereof. For the typically fewer number of cables running horizontally from one longitudinal support portion to the other and those running to and from organizational elements 22 on the rack, the rack may preferably have one or more spanning elements 20 having protruding retention devices 37a attached thereto and associated apertures or equipment for mounting such devices 37a.

A front base portion 13a and rear base portion 13b extend perpendicularly from the plane of the rectangular frame 12 at the bottom thereof to provide support for the frame. The front base portion 13a also forms a cable guiding trough section that provides for routing of cables in the horizontal direction.

The top of the frame includes perpendicularly extending front and rear top cable guiding portions 17a and 17b, respectively, adjacent the top transverse support member.

A front top cable guiding portion 17a includes a bracket 23 on each end thereof with a hinge support 24, such as an aperture therein or a bushing thereon. Similarly, the front base portion 13a includes a hinge support 26, such as an aperture or bushing, at each end thereof.

In the illustrated embodiment, the front top cable guiding portion 17a includes on each of its ends a bend radius control portion 18 of a predetermined radius to provide controlled routing of cables along the top of the rack that enter the vertically oriented cable pathway, and prevent such cables from bending with too small a radius of curvature. This feature is particularly important in fiberoptic cabling applications because sharp cable turns can degrade the fiberoptic signals carried in the cable.

The management rack 10 also includes doors 30 for covering the vertical cabling adjoining the longitudinal support portions 14. The doors 30 have generally planar, rectangular panel portions 32 sized appropriately for covering the vertical cabling and at opposite ends thereof have hinges, such as pins, for providing rotational attachment to the frame 12. In the illustrated embodiment, the doors 30 each have a first hinge pin 34 of appropriate diameter for engaging the apertures 24 on the bracket 23 extending from the top extension portion 17a and a second hinge pin 36 for engaging the bushings 26 on the front base portion 13a.

Figure 5:
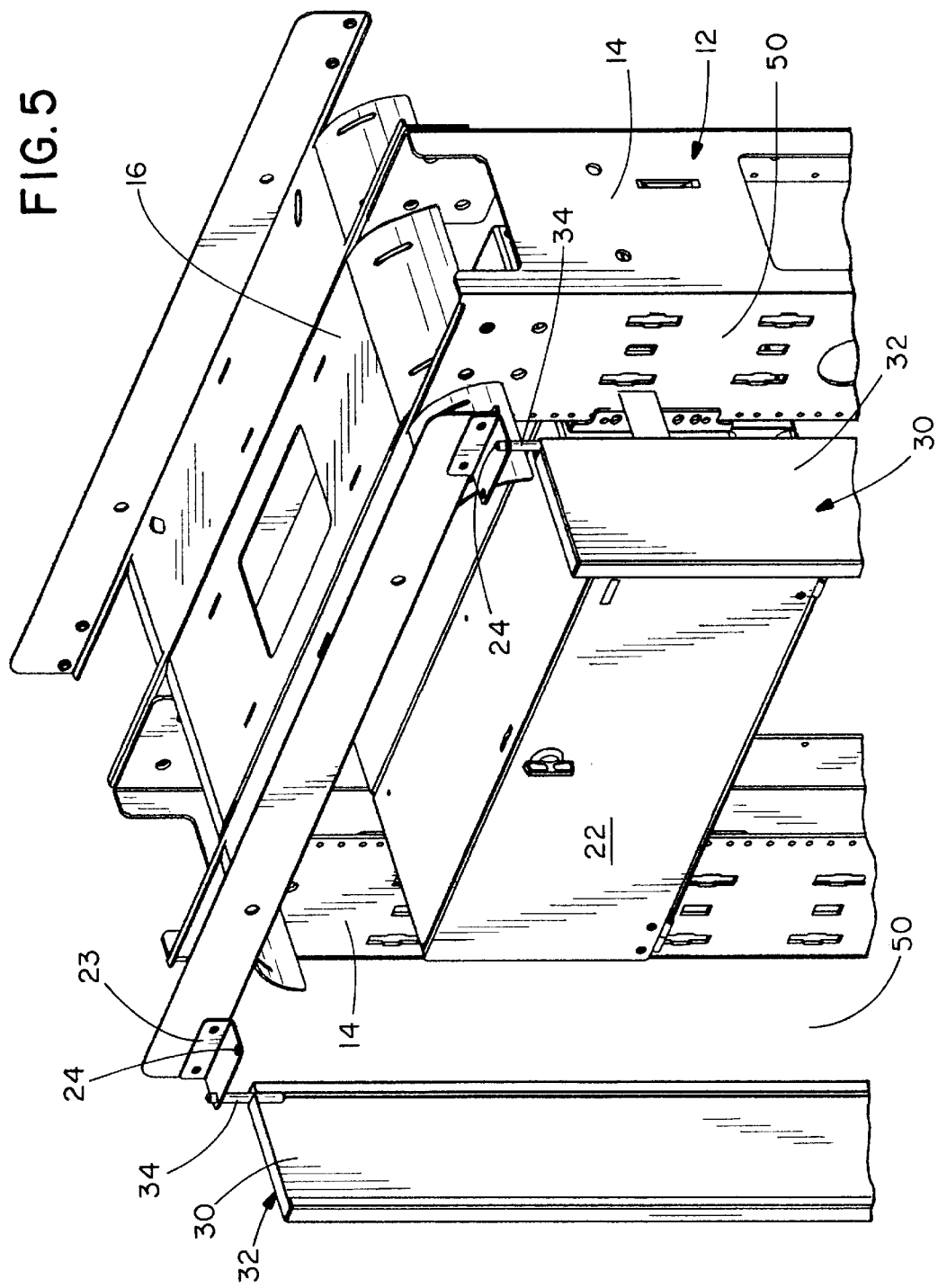
FIG. 5 is a close-up, broken view of a top portion of the management rack of the present invention.
Figure 6:
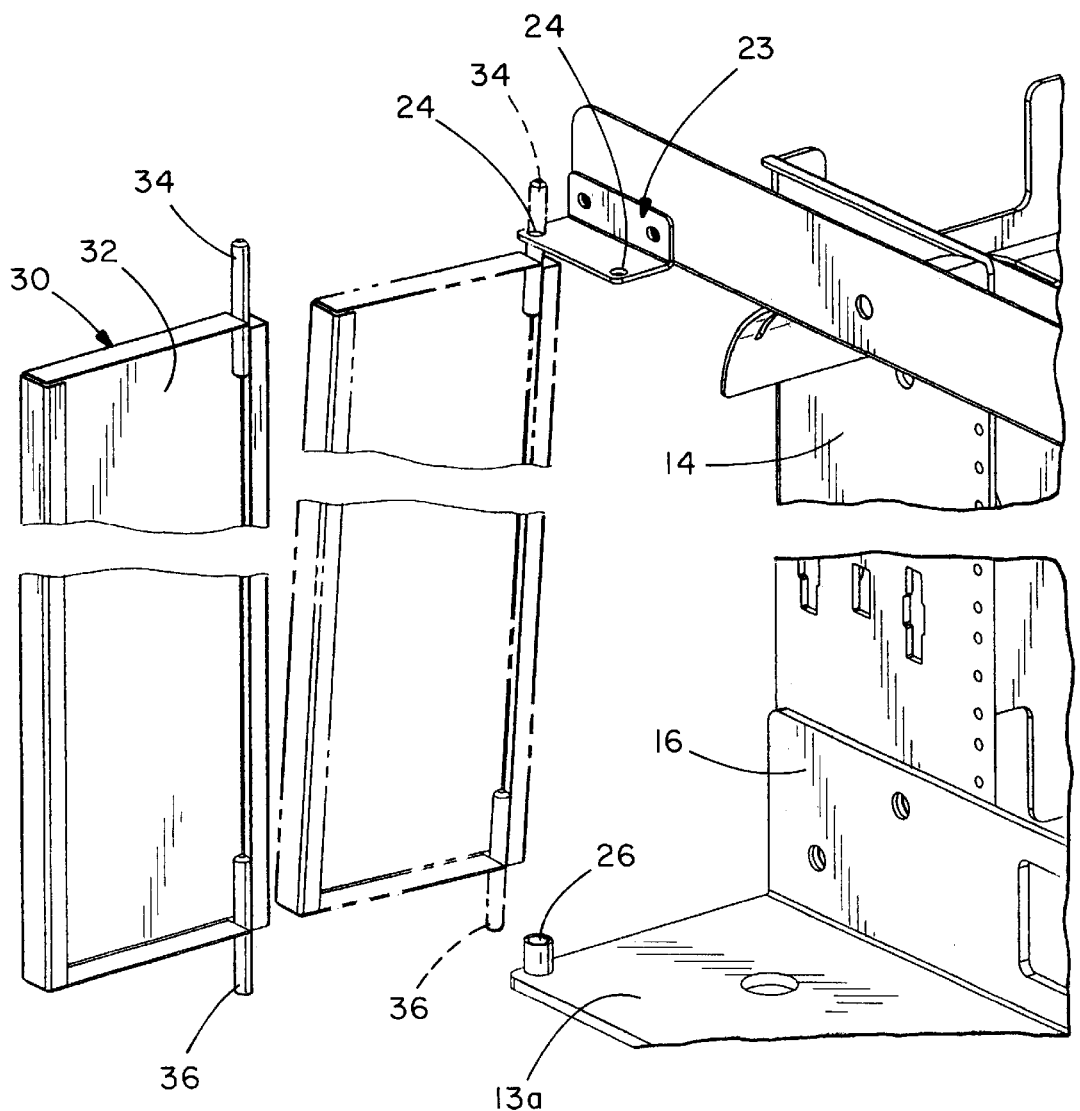
FIG. 6 is an enlarged partial perspective view of the management rack of the present invention with a middle portion broken away.
Figure 7:
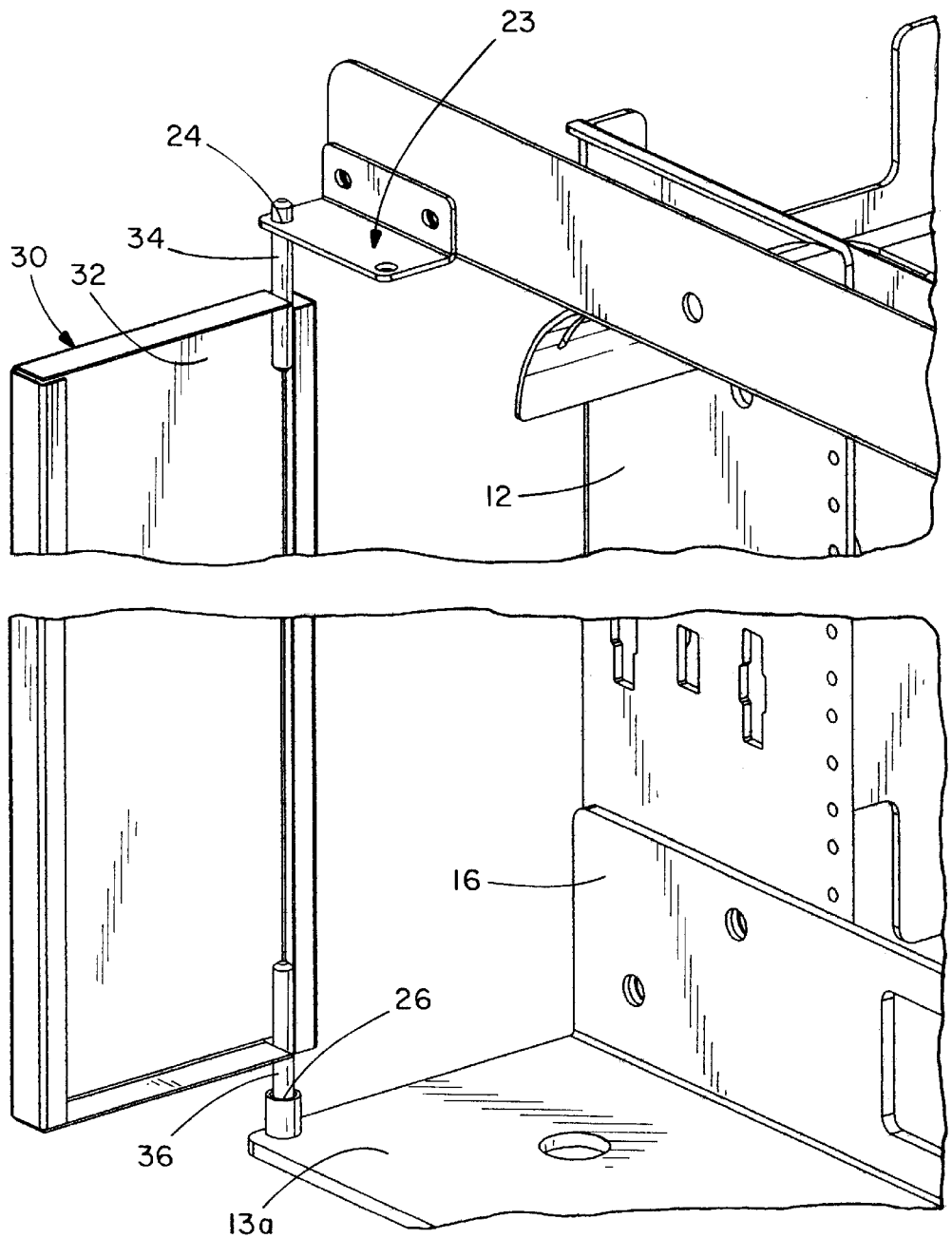
FIG. 7 is an enlarged partial perspective view of the management rack of the present invention with a middle portion broken away and the door in the open position.

FIGS. 5–7 show the attachment of one of the doors 30 to the frame 12. First, one manually moves the door 30 to align the pin 34 with the aperture 24 on the bracket 23. Then, by raising the door 30 so that the pin 24 extends through the aperture as far as it will go before the door panel 32 meets the bracket 23, one brings the end of the opposite pin 36 above the level of the bushing 26. Next, one aligns the pin 36 with the bushing 26 on the front base portion 13a and lowers the door panel so that the pin 36 is inserted into the bushing 26 and comes to rest inside it. The upper pin 34 is lowered in the process, but not sufficiently to allow it to emerge from the aperture 24.

Both the bushing 26 and the aperture 24 permit rotational movement of the pins 34 and 36 along the axis defined thereby, but restrict any non-axial translation of the door 30. Thus, the doors 30 may be oriented in a closed position, seen in FIG. 1 for example, wherein further rotation is limited by D-rings 38 disposed on the longitudinal support portions 14 or by other hardware associated with the frame 12, or they may be oriented in an open position, seen in FIG. 2 for example, angularly offset from the closed position by 90°. Though the figures do not show opening beyond 90°, the doors 30 in the illustrated embodiment may open as much as approximately 270° before again contacting frame hardware. Variable amounts of friction may be optionally applied at the aperture 24 and/or bushing 26 to make the doors 30 easier or harder to open and close and more or less able to retain intermittent angular positions between the fully open and fully closed positions.

Thus, the entire vertical cable pathway extending from the top cable guiding portion to the cable guiding trough section can be aesthetically and functionally protected while maintaining the ease of access required for such applications.

It should be noted that the above-described and illustrated embodiments of the invention are not an exhaustive listing of the forms a management rack in accordance with the invention could take; rather, they serve as exemplary and illustrative of preferred embodiments of the invention as presently understood. Many other forms of the invention are believe to exist. Examples in exhaustively include racks where transversely disposed elements other than those illustrated or described are mounted thereon, racks where the hinge apparatus permitting rotation of the doors relative to the frame are by means other than a pin floating freely in an aperture or bushing, or where the bushing is open on both sides, and racks where the doors may be made of appropriate material to provide electrical shielding for cabling disposed on the racks

What is claimed is:

1. An equipment rack comprising:

a base for resting on a generally flat horizontal surface;

a rectangular frame supported by said base, said frame for supporting at least one spanning element thereon and including a pair of vertical support portions extending upwardly from said base and a pair of horizontal support portions connecting said vertical support portions;

a vertically oriented cable routing pathway formed adjacent to one of said vertical support portions, said cable routing pathway extending from one of said horizontal support portions to the other of said horizontal support portions;

a first hinge support disposed in a first location on said frame;

a second hinge support disposed in a second location on said frame; and a door having a first hinge for engaging said first hinge support and having a second hinge for engaging said second hinge support whereby said door is rotatable about a vertical axis on said hinges between a closed position wherein said cable routing pathway is at least partially covered by said door substantially from said one horizontal support portion to said other horizontal support portion, and an open position wherein said cable routing pathway is not covered by said door.

2. An equipment rack in accordance with claim 1 wherein said cable routing pathway is formed by a plurality of cable management rings disposed on one of said vertical support portions.

3. An equipment rack in accordance with claim 1 wherein said cable routing pathway is formed by at least one wiring duct section disposed on one of said vertical support portions.

4. An equipment rack in accordance with claim 1 wherein one of said horizontal support portions connects the top ends of said vertical support portions.

5. An equipment rack in accordance with claim 4 wherein said first horizontal portion includes a bend radius control portion extending therefrom.

6. An equipment management rack in accordance with claim 4 wherein the other of said horizontal support portions connects the bottom ends of said vertical support portions.

7. An equipment rack in accordance with claim 1 wherein said first and second hinge supports include bushings and said first and second hinges are insertable into said bushings and rotatable therein.

8. An equipment rack in accordance with claim 7 wherein said engagement between said hinges and said bushings includes slack to facilitate removal of said door from said frame.

9. An equipment rack in accordance with claim 1 wherein said first and second hinge supports protrude from the plane of said rectangular frame.

* * * * *